(12) United States Patent
Inspektor et al.

(10) Patent No.: US 8,859,114 B2
(45) Date of Patent: Oct. 14, 2014

(54) COATING FOR IMPROVED WEAR RESISTANCE

(71) Applicant: Kennametal Inc., Latrobe, PA (US)

(72) Inventors: Aharon Inspektor, Pittsburgh, PA (US);
Nicholas F Waggle, Jr., Derry, PA (US);
Michael F Beblo, Delmont, PA (US);
Mark J Rowe, New Derry, PA (US);
Zhigang Ban, Perrysburg, OH (US)

(73) Assignee: Kennametal Inc., Latrobe, PA (US)

( * ) Notice: Subject to any disclaimer, the term of this patent is extended or adjusted under 35 U.S.C. 154(b) by 0 days.

(21) Appl. No.: 13/860,279

(22) Filed: Apr. 10, 2013

(65) Prior Publication Data

US 2013/0224519 A1 Aug. 29, 2013

Related U.S. Application Data

(63) Continuation of application No. 13/051,832, filed on Mar. 18, 2011, now Pat. No. 8,440,328.

(51) Int. Cl.
*C23C 14/06* (2006.01)
*C23C 30/00* (2006.01)
*B32B 9/00* (2006.01)
*B23B 27/14* (2006.01)
*C23C 16/30* (2006.01)

(52) U.S. Cl.
CPC .............. *C23C 16/30* (2013.01); *C23C 30/005* (2013.01); *B32B 9/00* (2013.01); *B23B 27/148* (2013.01); *C23C 14/0641* (2013.01)
USPC ............ 428/697; 51/307; 51/309; 204/192.1; 204/192.15; 204/192.16; 428/698; 428/699

(58) Field of Classification Search
USPC ................... 51/307, 309; 428/697, 698, 699; 204/192.1, 192.15, 192.16
See application file for complete search history.

(56) References Cited

U.S. PATENT DOCUMENTS

| | | |
|---|---|---|
| 4,469,801 A | 9/1984 | Hirai et al. |
| 4,507,189 A | 3/1985 | Doi et al. |
| 4,525,415 A | 6/1985 | Porat |
| 4,540,596 A | 9/1985 | Nimmagadda |
| 4,599,281 A | 7/1986 | Schintlmeister et al. |
| 4,694,990 A | 9/1987 | Karlsson et al. |
| 4,714,660 A | 12/1987 | Gates, Jr. |
| 4,753,854 A | 6/1988 | Gavrilov et al. |
| 4,961,529 A | 10/1990 | Gottselig et al. |
| 4,970,092 A | 11/1990 | Gavrilov et al. |
| 5,182,238 A | 1/1993 | Holleck |
| 5,208,102 A | 5/1993 | Schulz et al. |
| 5,223,332 A | 6/1993 | Quets |

(Continued)

FOREIGN PATENT DOCUMENTS

| | | |
|---|---|---|
| DE | 4115616 C2 | 11/1994 |
| DE | 10262174 B4 | 3/2007 |

(Continued)

*Primary Examiner* — Archene Turner
(74) *Attorney, Agent, or Firm* — Matthew W. Gordon, Esq.

(57) ABSTRACT

In one aspect, coated cutting tools are described herein which, in some embodiments, can demonstrate improved wear resistance in one or more cutting applications. In some embodiments, a coated cutting tool described herein comprises a substrate and a coating adhered to the substrate, the coating comprising an inner layer deposited by physical vapor deposition and an outer deposited by physical vapor deposition over the inner layer.

20 Claims, 9 Drawing Sheets

(56) References Cited

U.S. PATENT DOCUMENTS

| | | |
|---|---|---|
| 5,318,840 A | 6/1994 | Ikeda et al. |
| 5,330,853 A | 7/1994 | Hofmann et al. |
| 5,451,470 A | 9/1995 | Ashary et al. |
| 5,580,653 A | 12/1996 | Tanaka et al. |
| 5,882,778 A | 3/1999 | Sugizaki et al. |
| 6,586,122 B2 | 7/2003 | Ishikawa et al. |
| 7,056,602 B2 | 6/2006 | Horling et al. |
| 7,150,925 B2 | 12/2006 | Sato et al. |
| 7,510,761 B2 | 3/2009 | Kondo et al. |
| 7,939,186 B2 | 5/2011 | Takaoka et al. |

FOREIGN PATENT DOCUMENTS

| | | |
|---|---|---|
| EP | 1400609 B1 | 11/2006 |
| EP | 1690959 B1 | 9/2009 |
| JP | 07-310174 | 11/1995 |
| JP | 08-118106 | 5/1996 |
| JP | 08-120445 | 5/1996 |
| JP | 08-209336 | 8/1996 |
| JP | 09-011004 | 1/1997 |
| JP | 11-131215 | 5/1999 |
| JP | 2000-297364 | 10/2000 |
| JP | 2002-337006 | 11/2002 |
| JP | 2003-025113 | 1/2003 |
| WO | 9727965 | 8/1997 |
| WO | 9822244 | 5/1998 |

COATING FOR IMPROVED WEAR RESISTANCE

RELATED APPLICATION DATA

Pursuant to 35 U.S.C. §120, the present application is a continuation application of U.S. patent application Ser. No. 13/051,832, filed Mar. 18, 2011.

FIELD OF THE INVENTION

The present invention relates to coatings and, in particular, to coatings deposited by physical vapor deposition (PVD).

BACKGROUND

Cutting tools, including cemented carbide cutting tools, have been used in both coated and uncoated conditions for machining various metals and alloys. In order to increase cutting tool wear resistance and lifetime, one or more layers of refractory materials have been applied to cutting tool surfaces. TiC, TiCN, TiN and $Al_2O_3$, for example, have been applied to cemented carbide substrates by chemical vapor deposition (CVD). Moreover, in recognizing some shortcomings of CVD coatings related to specific cutting applications, cutting tool manufacturers have also provided refractory coatings applied by PVD. TiN coatings applied by PVD, for example, have been generally accepted in the cutting tool community.

One disadvantage of TiN coatings is the susceptibility to oxidation at relatively low temperatures. TiN coatings, for example, demonstrate oxidation beginning at about 550° C. As a result, aluminum has been added to TiN coatings in efforts to increase the oxidation resistance. Silicon has additionally been added to TiN coatings to increase oxidation resistance. However, the addition of silicon to TiN and/or TiAlN coatings can induce significant stresses in the coatings thereby inducing premature coating failure by delamination from the cutting tool surface.

U.S. Pat. No. 6,586,122 addresses methods of incorporating silicon into TiN and TiAlN coatings to increase oxidation resistance while reducing residual compressive stresses of the coatings. The synthetic methods disclosed in U.S. Pat. No. 6,586,122 induce a phase separated coating wherein a high silicon concentration $Si_3N_4$ nanophase is dispersed throughout a low silicon concentration TiSiN matrix phase. Dispersing a high silicon concentration $Si_3N_4$ nanophase throughout a low silicon concentration matrix phase can reduce lattice strain induced by the substitution of Ti with Si in a TiN or TiAlSiN coating.

The synthetic methods required to induce such a phase separated coating, nevertheless, are unconventional and require alteration of traditional PVD methods and/or equipment, thereby potentially limiting widespread application of the methods and increasing coated tool production costs.

SUMMARY

In one aspect, coated cutting tools are described herein which, in some embodiments, can demonstrate improved wear resistance in one or more cutting applications. In some embodiments, a coated cutting tool described herein comprises a substrate and a coating adhered to the substrate, the coating comprising an inner layer deposited by physical vapor deposition comprising aluminum and one or more metallic elements selected from the group consisting of metallic elements of Groups IVB, VB and VIB of the Periodic Table and one or more non-metallic elements selected from the group consisting of non-metallic elements of Groups IIIA, IVA and VIA of the Periodic Table and an outer layer deposited by physical vapor deposition over the inner layer, the outer layer comprising aluminum and silicon and one or more metallic elements selected from the group consisting of metallic elements of Groups IVB, VB and VIB of the Periodic Table and one or more non-metallic elements selected from the group consisting of non-metallic elements of Groups IIIA, IVA and VIA of the Periodic Table, wherein the amount of silicon in the outer layer decreases toward the inner layer.

In another aspect, a coated cutting tool described herein comprises a substrate and a coating adhered to the substrate, the coating comprising an inner layer deposited by physical vapor deposition comprising aluminum and one or more metallic elements selected from the group consisting of metallic elements of Groups IVB, VB and VIB of the Periodic Table and one or more non-metallic elements selected from the group consisting of non-metallic elements of Groups IIIA, IVA and VIA of the Periodic Table and an outer layer deposited by physical vapor deposition over the inner layer. The outer layer of the coating comprises a phase composed of aluminum and silicon and one or more metallic elements selected from the group consisting of metallic elements of Groups IVB, VB and VIB of the Periodic Table and one or more non-metallic elements selected from the group consisting of non-metallic elements of Groups IIIA, IVA and VIA of the Periodic Table and a phase composed of aluminum and silicon and one or more non-metallic elements selected from the group consisting of non-metallic elements of Groups IIIA, IVA and VIA of the Periodic Table.

In some embodiments, coatings described herein demonstrate residual compressive stresses. In some embodiments, a coated cutting tool described herein comprises a substrate and a coating adhered to the substrate, the coating comprising an inner layer deposited by physical vapor deposition comprising aluminum and one or more metallic elements selected from the group consisting of metallic elements of Groups IVB, VB and VIB of the Periodic Table and one or more non-metallic elements selected from the group consisting of non-metallic elements of Groups IIIA, IVA and VIA of the Periodic Table and an outer layer deposited by physical vapor deposition over the inner layer, the outer layer comprising aluminum and silicon and one or more metallic elements selected from the group consisting of metallic elements of Groups IVB, VB and VIB of the Periodic Table and one or more non-metallic elements selected from the group consisting of non-metallic elements of Groups IIIA, IVA and VIA of the Periodic Table, wherein the coating has a residual compressive stress and/or compressive shear stress.

In another aspect, methods of making coated cutting tools are described herein. In some embodiments, a method of making a coated cutting tool comprises providing a cutting tool substrate and depositing an inner layer of a coating on the substrate by physical vapor deposition, the inner layer comprising aluminum and one or more metallic elements selected from the group consisting of metallic elements of Groups IVB, VB and VIB of the Periodic Table and one or more non-metallic elements selected from the group consisting of non-metallic elements of Groups IIIA, IVA and VIA of the Periodic Table. An outer layer of the coating is deposited over the inner layer by physical vapor deposition, the outer layer comprising aluminum and silicon and one or more metallic elements selected from the group consisting of metallic elements of Groups IVB, VB and VIB of the Periodic Table and one or more non-metallic elements selected from the group consisting of non-metallic elements of Groups IIIA, IVA and VIA of the Periodic Table, wherein the amount of silicon in the outer layer is decreased toward the inner layer.

In some embodiments, an outer layer is deposited over the inner layer by physical vapor deposition, the outer layer comprising a phase composed of aluminum and silicon and one or more metallic elements selected from the group consisting of metallic elements of Groups IVB, VB and VIB of the Periodic Table and one or more non-metallic elements selected from the group consisting of non-metallic elements of Groups IIIA, IVA and VIA of the Periodic Table and a phase composed of aluminum and silicon and one or more non-metallic elements selected from the group consisting of non-metallic elements of Groups IIIA, IVA and VIA of the Periodic Table.

In another aspect, methods of increasing the cutting lifetime of a coated cutting tool are described herein. In some embodiments, a method of increasing the cutting lifetime of a coated cutting tool comprises directing one or more coating fatigue mechanisms to an interface of an inner layer and an outer layer of the coating by producing the inner layer from a composition deposited by physical vapor deposition comprising aluminum and one or more metallic elements selected from the group consisting of metallic elements of Groups IVB, VB and VIB of the Periodic Table and one or more non-metallic elements selected from the group consisting of non-metallic elements of Groups IIIA, IVA and VIA of the Periodic Table and producing the outer layer from a composition deposited by physical vapor deposition comprising aluminum and silicon and one or more metallic elements selected from the group consisting of metallic elements of Groups IVB, VB and VIB of the Periodic Table and one or more non-metallic elements selected from the group consisting of non-metallic elements of Groups IIIA, IVA and VIA of the Periodic Table, wherein the amount of silicon in the outer layer decreases toward the inner layer.

In some embodiments, directing comprises initiating one or more coating fatigue mechanisms at an interface of the inner layer and the outer layer of the coating.

These and other embodiments are described in greater detail in the detailed description which follows.

DETAILED DESCRIPTION

Figure 1:
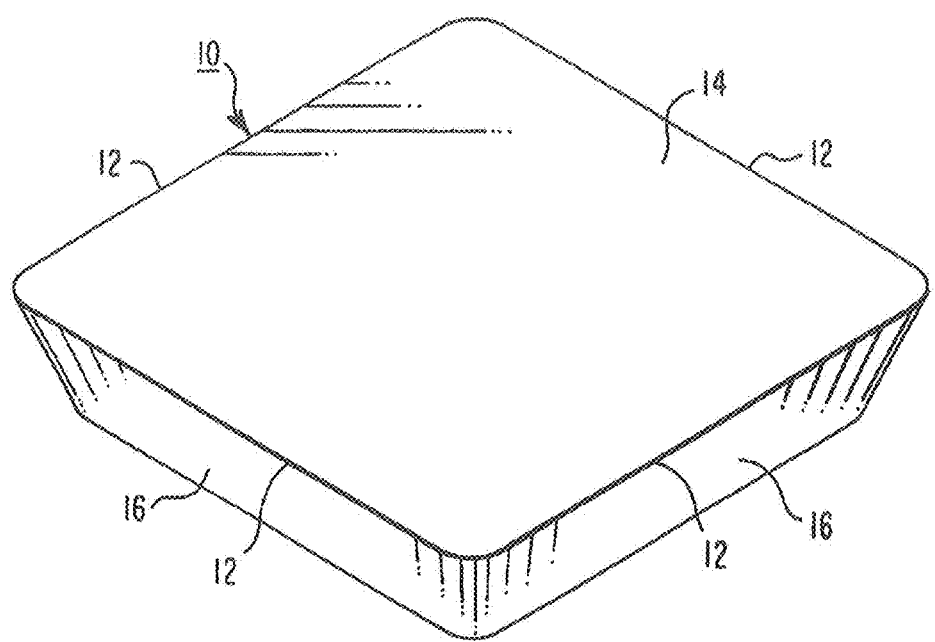
FIG. 1 illustrates a substrate of a coated cutting tool according to one embodiment described herein.

Embodiments described herein can be understood more readily by reference to the following detailed description and examples and their previous and following descriptions. Elements, apparatus and methods described herein, however, are not limited to the specific embodiments presented in the detailed description and examples. It should be recognized that these embodiments are merely illustrative of the principles of the present invention. Numerous modifications and adaptations will be readily apparent to those of skill in the art without departing from the spirit and scope of the invention.

In one aspect, coated cutting tools are described herein which, in some embodiments, can demonstrate improved wear resistance in one or more cutting applications. In some embodiments, a coated cutting tool described herein comprises a substrate and a coating adhered to the substrate, the coating comprising an inner layer deposited by physical vapor deposition comprising aluminum and one or more metallic elements selected from the group consisting of metallic elements of Groups IVB, VB and VIB of the Periodic Table and one or more non-metallic elements selected from the group consisting of non-metallic elements of Groups IIIA, IVA and VIA of the Periodic Table and an outer layer deposited by physical vapor deposition over the inner layer, the outer layer comprising aluminum and silicon and one or more metallic elements selected from the group consisting of metallic elements of Groups IVB, VB and VIB of the Periodic Table and one or more non-metallic elements selected from the group consisting of non-metallic elements of Groups IIIA, IVA and VIA of the Periodic Table, wherein the amount of silicon in the outer layer decreases toward the inner layer.

In another aspect, a coated cutting tool described herein comprises a substrate and a coating adhered to the substrate, the coating comprising an inner layer deposited by physical vapor deposition comprising aluminum and one or more metallic elements selected from the group consisting of metallic elements of Groups IVB, VB and VIB of the Periodic Table and one or more non-metallic elements selected from the Group consisting of non-metallic elements of Groups IIIA, IVA and VIA of the Periodic Table and an outer layer deposited by physical vapor deposition over the inner layer. The outer layer of the coating comprises a phase composed of aluminum and silicon one or more metallic elements selected from the group consisting of metallic elements of Groups IVB, VB and VIB of the Periodic Table and one or more non-metallic elements selected from the group consisting of non-metallic elements of Groups IIIA, IVA and VIA of the Periodic Table and a phase composed of aluminum and silicon and one or more non-metallic elements selected from the group consisting of non-metallic elements of Groups IIIA, IVA and VIA of the Periodic Table.

Turning now to components of a coated cutting tool described herein, a coated cutting tool described herein comprises a substrate. A coated cutting tool described herein can comprise any substrate not inconsistent with the objectives of the present invention. In some embodiments, a substrate comprises a cemented carbide, carbide, ceramic, cermet or steel.

A cemented carbide substrate, in some embodiments, comprises tungsten carbide (WC). In some embodiments, WC is present in a substrate in an amount of at least about 70 weight percent. In some embodiments, WC is present in a substrate in an amount of at least about 80 weight percent or in an amount of at least about 85 weight percent. Additionally, in some embodiments, the binder of a cemented carbide substrate comprises cobalt or cobalt alloy. Cobalt, in some embodiments, is present in a cemented carbide substrate in an amount ranging from about 3 weight percent to about 15 weight percent. In some embodiments, cobalt is present in a cemented carbide substrate in an amount ranging from about 5 weight percent to about 12 weight percent or from about 6 weight percent to about 10 weight percent. In some embodiments, a cemented carbide substrate may exhibit a zone of binder enrichment beginning at and extending inwardly from the surface of the substrate.

A cemented carbide substrate, in some embodiments, further comprises one or more additives such as, for example, one or more of the following elements and/or their compounds: titanium, niobium, vanadium, tantalum, chromium, zirconium and/or hafnium. In some embodiments, titanium, niobium, vanadium, tantalum, chromium, zirconium and/or hafnium form solid solution carbides with the WC in the substrate. The substrate, in some embodiments, comprises one or more solid solution carbides in an amount ranging from about 0.1 weight percent to about 5 weight percent. Additionally, in some embodiments, a cemented carbide substrate comprises nitrogen.

In some embodiments, a substrate of a coated cutting tool described herein comprises one or more cutting edges formed at the juncture of a rake face and flank faces of the substrate. FIG. 1 illustrates a substrate of a coated cutting tool according to one embodiment described herein. As illustrated in FIG. 1, the substrate (10) has cutting edges (12) formed at the junction of the substrate rake face (14) and flank faces (16).

In some embodiments, a substrate of a coated cutting tool can comprise an insert, drill bit, saw blade or other cutting apparatus.

As described herein, a coating adhered to the substrate comprises a inner layer deposited by physical vapor deposition comprising aluminum and one or more metallic elements selected from the group consisting of metallic elements of Groups IVB, VB and VIB of the Periodic Table and one or more non-metallic elements selected from the group consisting of non-metallic elements of Groups IIIA, IVA and VIA of the Periodic Table. Groups of the Periodic Table described herein are identified according to the CAS designation.

In some embodiments, one or more metallic elements of Groups IVB, VB and VIB suitable for combination with aluminum in the production of an inner layer of a coating described herein comprise titanium, zirconium, hafnium, vanadium, niobium, tantalum and/or chromium. Moreover, in some embodiments, one or more non-metallic elements of Groups IIIA, IVA and VIA suitable for use in the production of an inner layer of a coating described herein comprise boron, carbon, nitrogen and/or oxygen. In some embodiments, an inner layer of a coating described herein has a composition according to the following relationship:

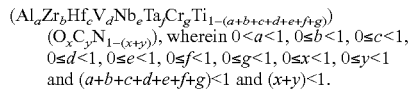
$(O_xC_yN_{1-(x+y)})$, wherein $0 < a < 1$, $0 \leq b < 1$, $0 \leq c < 1$,
$0 \leq d < 1$, $0 \leq e < 1$, $0 \leq f < 1$, $0 \leq g < 1$, $0 \leq x < 1$, $0 \leq y < 1$
and $(a+b+c+d+e+f+g) < 1$ and $(x+y) < 1$.

In some embodiments, an inner layer of a coating described herein has a composition according to the following relationship: $Al_aTi_{1-a}N$ wherein $0 < a < 1$. In some embodiments of an inner layer having the composition $Al_aTi_{1-a}N$, $0.3 \leq a \leq 0.8$. In some embodiments, $0.35 \leq a \leq 0.75$. In some embodiments, $0.4 \leq a \leq 0.7$ or $0.42 \leq a \leq 0.65$.

In some embodiments, $Al_aTi_{1-a}N$ of an inner layer of a coating described herein is in the crystalline phase. $Al_aTi_{1-a}N$ of an inner layer, in some embodiments, displays a cubic crystalline structure. In some embodiments, the cubic crystalline structure of $Al_aTi_{1-a}N$ of an inner layer is face centered cubic (fcc). In some embodiments, $Al_aTi_{1-a}N$ of an inner layer displays a hexagonal crystalline structure. In some embodiments, $Al_aTi_{1-a}N$ of an inner layer displays a mixture of cubic crystalline structure and hexagonal crystalline structure.

Moreover, in some embodiments, an inner layer of a coating described herein is polycrystalline having an average crystallite size of at least about 10 nm. In some embodiments, an inner layer of a coating has an average crystallite size of at least about 20 nm or at least about 50 nm. In some embodiments, an inner layer of a coating has an average crystallite size ranging from about 10 nm to about 100 nm or from about 20 nm to about 80 nm. An inner layer of a coating, in some embodiments, has an average crystallite size ranging from about 30 nm to about 70 nm. In some embodiments, an inner layer of a coating has an average crystallite size greater than 100 nm.

An inner layer of a coating described herein can have any desired thickness not inconsistent with the objectives of the present invention. In some embodiments, an inner layer of a coating has a thickness ranging from about 1 μm to about 10 μm. In some embodiments, an inner layer has a thickness ranging from about 2 μm to about 8 μm or from about 3 μm to about 7 μm. In some embodiments, an inner layer has a thickness ranging from about 1.5 μm to about 5 μm or from about 2 μm to about 4 μm. In some embodiments, an inner layer of a coating has a thickness less than about 1 μm or greater than about 10 μm.

As described further herein, an inner layer of a coating, in some embodiments, is deposited directly on a surface of the cutting tool substrate by physical vapor deposition. Alternatively, in some embodiments, one or more additional layers may be disposed between a surface of the substrate and the inner layer such that the inner layer is not in direct contact with the surface of the substrate.

A coating described herein also comprises an outer layer deposited by physical vapor deposition over the inner layer, the outer layer comprising aluminum and silicon and one or more metallic elements selected from the group consisting of metallic elements of Groups IVB, VB, and VIB of the Periodic Table and one or more non-metallic elements selected from the group consisting of non-metallic elements of Groups IIIA, IVA and VIA of the Periodic Table, wherein the amount of silicon in the outer layer decreases toward the inner layer.

In some embodiments, one or more metallic elements of Groups IVB, VB and VIB suitable for combination with aluminum and silicon in the production of an outer layer of a coating described herein comprise titanium, zirconium, hafnium, vanadium, niobium, tantalum and/or chromium. Moreover, in some embodiments, one or more non-metallic elements of Groups IIIA, IVA and VIA suitable for use in the production of an outer layer of a coating described herein comprise boron, carbon, nitrogen and/or oxygen. In some embodiments, an outer layer of a coating described herein has a composition according to the following relationship:

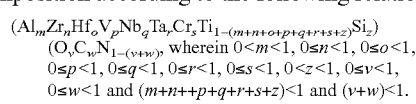
$(O_vC_wN_{1-(v+w)})$, wherein $0 < m < 1$, $0 \leq n < 1$, $0 \leq o < 1$,
$0 \leq p < 1$, $0 \leq q < 1$, $0 \leq r < 1$, $0 \leq s < 1$, $0 < z < 1$, $0 \leq v < 1$,
$0 \leq w < 1$ and $(m+n++p+q+r+s+z) < 1$ and $(v+w) < 1$.

In some embodiments, an outer layer of a coating described herein comprises a phase composed of $Al_mTi_{1-(m+z)}Si_zN$ where $0 < m < 1$ and $0 < z < 1$ and $(m+z) < 1$. In some embodiments, the silicon content of the $Al_mTi_{1-(m+z)}Si_zN$ phase decreases toward the inner layer of the coating. In some embodiments, $0.05 \leq m \leq 0.75$. In some embodiments, $0.1 \leq m \leq 0.65$. In some embodiments, $0.15 \leq m \leq 0.60$. In some embodiments, $0.01 \leq z \leq 0.3$. In some embodiments, $0.02 \leq z \leq 0.25$.

In some embodiments of an outer layer phase composed of $Al_mTi_{1-(m+z)}Si_zN$, $0.05 \leq m \leq 0.75$ and $0.01 \leq z \leq 0.3$ or $0.05 \leq m \leq 0.75$ and $0.02 \leq z \leq 0.25$. In some embodiments, $0.1 \leq m \leq 0.65$ and $0.01 \leq z \leq 0.3$ or $0.1 \leq m \leq 0.65$ and $0.02 \leq z \leq 0.25$. In some embodiments, $0.15 \leq m \leq 0.60$ and $0.01 \leq z \leq 0.3$ or $0.15 \leq m \leq 0.60$ and $0.02 \leq z \leq 0.25$.

In some embodiments, an outer layer of a coating described herein comprising a phase composed of $Al_m Ti_{1-(m+z)} Si_z N$ further comprises an additional phase composed of $Al_{1-k} Si_k N$ where $0 \leq k < 1$. In some embodiments, the silicon content of an $Al_{1-k} Si_k N$ phase decreases toward the inner layer. In some embodiments, the silicon content of an $Al_{1-k} Si_k N$ phase does not decrease toward the inner layer.

In some embodiments, an outer layer of a coating described herein comprising a phase composed of $Al_m Ti_{1-(m+z)} Si_z N$ further comprises an additional phase composed of one or more titanium silicides, $Ti_h Si_l$, where h is an integer ranging from 1 to 5 and l is an integer ranging from 1 to 4. In some embodiments, for example, a titanium silicide of an outer layer is $TiSi$, $TiSi_2$, $Ti_5 Si_3$, $Ti_5 Si_4$ or $Ti_3 Si$.

In some embodiments wherein an additional phase of $Al_{1-k} Si_k N$ and/or titanium silicide is present in the outer layer, the phase composed of $Al_m Ti_{1-(m+z)} Si_z N$ is the primary phase of the outer layer constituting greater than 50% of the outer layer. In some embodiments, $Al_m Ti_{1-(m+z)} Si_z N$ composes greater than 60% or greater than 70% of the outer layer. In some embodiments, an additional phase of $Al_{1-k} Si_k N$ composes up to about 35% of the outer layer. An additional phase of $Al_{1-k} Si_k N$, in some embodiments, composes from about 1% to about 30% of the outer layer. In some embodiments, an additional phase of $Al_{1-k} Si_k N$ composes from about 5% to about 25% or from about 10% to about 20% of the outer layer. In some embodiments, an additional phase of titanium silicide composes from about 1% to about 20% or from about 5% to about 15% of the outer layer.

The phase compositional percentages of an outer layer described herein can be determined using X-ray diffraction (XRD) techniques and the Rietveld refinement method. The Rietveld method is a full-pattern fit method. The measured specimen profile and a calculated profile are compared. By variation of several parameters known to one of skill in the art, the difference between the two profiles is minimized. All phases present in the outer layer are accounted for in order to conduct a proper Rietveld refinement.

A cutting tool comprising a coating described herein can be analyzed according to XRD using a grazing incidence technique requiring a flat surface. The cutting tool rake face or flank face can be analyzed depending on cutting tool geometry. For compositional phase analysis of coated cutting tools described herein, a PANalytical Xpert MRD diffraction system fitted with a Eulerean cradle was used. X-ray diffraction analysis was completed using a parallel beam optics system fitted with a copper x-ray tube. The operating parameters were 45 KV and 40 MA. Typical optics for grazing incidence analysis included an x-ray mirror with 1/16 degree antiscatter slit and a 0.04 radian soller slit. Receiving optics included a flat graphite monochromator, parallel plate collimator, and a sealed proportional counter.

X-ray diffraction data was collected at a grazing angle selected to maximize coating peak intensity and minimize or eliminate interference peaks from the substrate. Counting times and scan rate were selected to provide optimal data for the Rietveld analysis. Prior to collection of the grazing incidence data, the specimen height was set using x-ray beam splitting.

A background profile was fitted and peak search was performed on the specimen data to identify all peak positions and peak intensities. The peak position and intensity data was used to identify the crystal phase composition of the specimen coating using any of the commercially available crystal phase databases.

Crystal structure data was input for each of the crystalline phases present in the specimen. Typical Rietveld refinement parameters settings are:

| | |
|---|---|
| Background calculation method: | Polynomial |
| Sample Geometry: | Flat Plate |
| Linear Absorption Coefficient: | Calculated from average specimen composition |
| Weighting Scheme: | Against Iobs |
| Profile Function: | Pseudo-Voight |
| Profile Base Width: | Chosen per specimen |
| Least Squares Type: | Newton-Raphson |
| Polarization Coefficient: | 1.0 |

The Rietveld refinement typically includes:

| | |
|---|---|
| Specimen Displacement: | shift of specimen from x-ray alignment |
| Background profile | selected to best describe the background profile of the diffraction data |
| Scale Function: | scale function of each phase |
| B overall: | displacement parameter applied to all atoms in phase |
| Cell parameters: | a, b, c and alpha, beta, and gamma |
| W parameter: | describes peak FWHM |

Any additional parameter to achieve an acceptable goodness of fit

All Rietveld phase analysis results are reported in weight percent values.

In comprising $Al_m Ti_{1-(m+z)} Si_z N$ and $Al_{1-k} Si_k N$ and/or titanium silicide phases in some embodiments, an outer layer of a coating described herein does not comprise a phase wherein the silicon has been separated from aluminum and/or one or more metallic elements of Groups IVB, VB and VIB of the Periodic Table. In some embodiments, for example, an outer layer of a coating described herein does not comprise or substantially comprise a silicon nitride phase, including $Si_3 N_4$.

In some embodiments, one or more phases of an outer layer of a coating described herein are crystalline. In some embodiments, for example, a phase of an outer layer composed of $Al_m Ti_{1-(m+z)} Si_z N$ is crystalline. In some embodiments, a crystalline $Al_m Ti_{1-(m+z)} Si_z N$ phase of an outer layer displays a cubic crystalline structure. In some embodiments, the cubic crystalline structure of an $Al_m Ti_{1-(m+z)} Si_z N$ phase is fcc.

In some embodiments, an additional phase of an outer layer composed of $Al_{1-k} Si_k N$ is crystalline. In some embodiments, a crystalline $Al_{1-k} Si_k N$ phase of an outer layer displays a hexagonal structure. In some embodiments, the hexagonal structure of an $Al_{1-k} Si_k N$ phase is wurzite. In some embodiments, an additional phase of an outer layer composed of a titanium silicide is crystalline. In some embodiments, for example, a $Ti_5 Si_3$ phase displays a hexagonal structure.

In some embodiments, an outer layer of a coating described herein is polycrystalline. In some embodiments, for example, a polycrystalline outer layer has an average crystallite size of at least about 10 nm. An outer layer, in some embodiments, has an average crystallite size of at least about 20 nm. In some embodiments, an outer layer has an average crystallite size ranging from about 10 nm to about 100 nm. In some embodiments, an outer layer has an average crystallite size ranging from about 20 nm to about 80 nm or from about 30 nm to about 70 nm. In some embodiments, an outer layer of a coating has an average crystallite size greater than 100 nm.

In some embodiments, one or more crystalline phases of an outer layer are polycrystalline having an average crystallite size described herein. In some embodiments, for example, a phase of an outer layer composed of $Al_mTi_{1-(m+z)}Si_zN$ is polycrystalline having an average crystallite size recited herein. In some embodiments, an additional phase of $Al_{1-k}Si_kN$ present in the outer layer is polycrystalline having an average crystallite size recited herein. In some embodiments, two or more polycrystalline phases of an outer layer have the same or substantially the same average crystallite size. In some embodiments, two or more polycrystalline phases of an outer layer have different average crystallite sizes.

An outer layer of a coating described herein can have any thickness not inconsistent with the objectives of the present invention. In some embodiments, an outer layer has a thickness of ranging from about 0.1 µm to about 10 µm. In some embodiments, an outer layer has a thickness ranging from about 0.2 µm to about 5 µm. An outer layer, in some embodiments, has a thickness ranging from about 0.5 µm to about 5 µm or from about 1 µm to about 4 µm.

As described herein, the amount of silicon in the outer layer, in some embodiments, decreases toward the inner layer. In some embodiments, the amount of silicon in the outer layer decreases toward the inner layer at a rate of at least about 7 atomic percent/µm. In some embodiments, the amount of silicon in the outer layer decreases toward the inner layer at a rate of at least about 8 atomic percent/µm or at least about 8.5 atomic percent/µm. In some embodiments, the amount of silicon in the outer layer decreases toward the inner layer at a rate of at least about 9 atomic percent/µm or at least about 9.5 atomic percent/µm. In some embodiments, the amount of silicon in the outer layer decreases toward the inner layer at a rate ranging from about 5 atomic percent/µm to about 15 atomic percent/µm. In some embodiments, the amount of silicon in the outer layer decreases toward the inner layer at a rate ranging from about 7 atomic percent/µm to about 11 atomic percent/µm.

In some embodiments, an outer layer of a coating described herein is deposited directly on the surface of the inner layer by physical vapor deposition. Alternatively, in some embodiments, one or more additional layers may be disposed between the inner layer and the outer layer. Additionally, in some embodiment, the outer layer is the outermost layer of the coating. In some embodiments, the outer layer is not the outermost layer of the coating. In some embodiments, for example, one or more additional layers can be applied to the outer layer to complete the coating.

A coating described herein, in some embodiments, has an adherence as measured by the Rockwell A indentation adhesion load test of greater than or equal to 60 kg. In some embodiments, a coating has an adherence as measured by the Rockwell A indentation adhesion load test of greater than or equal to 100 kg. In measuring the adherence of a coating to the substrate, a Rockwell hardness tester with a Rockwell A scale Brale cone shaped diamond indenter was used at the selected loads of 60 kg and 100 kg. The adhesive strength is defined as the minimum load at which the coating debonded. A coating adherence of greater than or equal to 60 kg recited herein indicated that no debonding of the coating was observed at the loading of 60 kg. Similarly, a coating adherence of greater than or equal to 100 kg recited herein indicated that no debonding of the coating was observed at the loading of 100 kg.

In some embodiments, coatings described herein demonstrate residual compressive stresses. In some embodiments, a coated cutting tool described herein comprises a substrate and a coating adhered to the substrate, the coating comprising an inner layer deposited by physical vapor deposition comprising aluminum and one or more metallic elements selected from the group consisting of metallic elements of Groups IVB, VB and VIB of the Periodic Table and one or more non-metallic elements selected from the group consisting of non-metallic elements of Groups IIIA, IVA and VIA of the Periodic Table and an outer layer deposited by physical vapor deposition over the inner layer, the outer layer comprising aluminum and silicon and one or more metallic elements selected from the group consisting of metallic elements of Groups IVB, VB and VIB of the Periodic Table and one or more non-metallic elements selected from the group consisting of non-metallic elements of Groups IIIA, IVA and VIA of the Periodic Table, wherein the coating has a residual compressive stress and/or compressive shear stress.

In some embodiments, a coating described herein comprising an inner layer and an outer layer deposited over the inner layer has a residual compressive stress prior to post coat blasting of at least about 2500 MPa. In some embodiments, a coating described herein comprising an inner layer and an outer layer deposited over the inner layer has a residual compressive stress prior to post coat blasting of at least about 2700 MPa or at least about 2800 MPa. A coating described herein comprising an inner layer and an outer layer deposited over the inner layer, in some embodiments, has a residual compressive stress prior to post coat blasting ranging from about 2500 MPa to about 3000 MPa or from about 2600 MPa to about 2900 MPa.

In some embodiments, a coating described herein comprising an inner layer and an outer layer deposited over the inner layer has a compressive shear stress prior to post coat blasting of at least about 20 MPa. In some embodiments, a coating described herein comprising an inner layer and an outer layer deposited over the inner layer has a compressive shear stress prior to post coat blasting of at least about 50 MPa or at least about 70 MPa. A coating described herein comprising an inner layer and an outer layer deposited over the inner layer, in some embodiments, has a compressive shear stress prior to post coat blasting ranging from about 20 MPa to about 130 MPa or from about 30 MPa to about 100 MPa.

In some embodiments, a coating described herein is in a post-coat blasted state. In some embodiments wherein the outer layer is the outermost layer, the outer layer receives post-coat blasting. In some embodiments, an outer layer described herein is blasted with an inorganic blasting agent. In some embodiments, for example, an outer layer is blasted with $Al_2O_3$ particles.

Post coat blasting, in some embodiments, can increase the residual compressive stress of the coating. In some embodiments, for example, the ratio of residual compressive stress of a coating described herein subsequent to post coat blasting to the residual compressive of the coating prior to post coat blasting is at least 1.2. In some embodiments, the ratio of residual compressive stress of a coating described herein subsequent to post coat blasting to the residual compressive stress prior to post coat blasting is at least 1.3 or at least 1.5. In some embodiments, the ratio of residual compressive stress of a coating described herein subsequent to post coat blasting to the residual compressive of the coating prior to post coat blasting ranges from about 1.1 to about 3 or from about 1.2 to about 2.

In some embodiments, a coating described herein comprising an inner layer and an outer layer deposited over the inner layer has a residual compressive stress subsequent to post coat blasting of at least about 3400 MPa. In some embodiments, a coating described herein has a residual compressive stress subsequent to post coat blasting of at least about 3500 MPa or at least about 3600 MPa. A coating described herein comprising an inner layer and an outer layer deposited over the inner layer, in some embodiments, has a residual compressive stress subsequent to post coat blasting ranging from about 3400 MPa to about 4000 MPa or from about 3500 MPa to about 3800 MPa.

In some embodiments, a coating described herein comprising an inner layer and an outer layer deposited over the inner layer has a compressive shear stress subsequent to post coat blasting of at least about 40 MPa. In some embodiments, a coating described herein comprising an inner layer and an outer layer deposited over the inner layer has a compressive shear stress subsequent to post coat blasting of at least about 50 MPa or at least about 60 MPa. A coating described herein comprising an inner layer and an outer layer deposited over the inner layer, in some embodiments, has a compressive shear stress subsequent to post coat blasting ranging from about 20 MPa to about 100 MPa or from about 30 MPa to about 70 MPa.

Residual stress and shear stress of a coating described herein was determined using the $Sin^2\psi$ method with reference to the (200) reflection on the AlTiSiN crystalline phase. The instrument used for residual stress determination was a PANalytical Xpert Pro MRD fitted with a Eulerian cradle for specimen manipulation. The x-ray source was a copper long fine focus x-ray tube operating at 45 KV and 40 MA. The instrument was configured with parallel beam optics for the determination of the stress in the coatings. The incident optics included a Poly-capillary lens—8 mm with cross-slit collimator. The receiving optics included a 0.27 degree parallel plate collimator, a flat graphite monochromator and a sealed proportional counter.

Chi tilts of 0, 28.88, 43.08, 56.77, 75.0, −28.88, −43.08, −56.77 and −75.0 were selected for the measurement of the residual stress levels. Data collection parameters for step size and count time were adjusted for each tilt angle to obtain adequate peak intensity for accurate determination of peak position.

Peak data was then corrected for Absorption and Transparency using the following equations:

Absorption Correction $$A = \left[1 - \frac{\tan(\omega - \theta)}{\tan\theta}\right] \times \left[1 - e^{\left(-\upsilon\tau \times \frac{2\sin\theta \times \cos(\omega - \theta)}{\sin^2\theta - \sin^2(\omega - \theta)}\right)}\right]$$

Transparency Correction $$\Delta 2\theta = \frac{180}{\pi} \times \frac{2\tau}{R} \times \frac{\sin(\theta)\cos(\theta)}{\sin(\omega)}$$

with $\tau = \frac{t}{\beta} \times \frac{(1 - \beta \times e^{-\beta} - e^{-\beta})}{1 - e^{-\beta}}$ and $\beta = \frac{2\mu t \sin\theta \times \cos(\omega - \theta)}{\sin^2\theta - \sin^2(\omega - \theta)}$ where:
t=thickness of layer
μ=linear absorption coefficient ($cm^{-1}$)
θ=2Theta/2 (degrees)
(ω−θ)=omega offset angle (degrees)
ψ=tilt angle (Psi stress) (degrees)
τ=information depth (microns)
R=Radius of goniometers (mm)

The peak data was corrected for Lorentz polarization using the following equation:

Polarization Correction $$LP = \frac{\cos^2 2\theta_{mon} \times \cos^2 2\theta}{\sin\theta}$$

$2\theta_{mon}$ = diffraction angle of graphite monochromator

The $K\alpha_2$ peaks were removed using the Ladell model. Peak positions were refined using a modified Lorentzian shape profile function.

The coating residual stress was calculated from the general equation:

$$\frac{d_{\varphi\psi} - d_0}{d_0} = S_1(\sigma_1 + \sigma_2) + \frac{1}{2}S_2\sigma_\varphi \sin^2\psi$$

where $\sigma_\varphi = \sigma_1 \cos^2\phi + \sigma_2 \sin^2\phi$
$d_{\varphi\psi}$=lattice constant at angle φ and tilt ψ
$d_o$=strain free lattice constant
φ=rotation angle
ψ=specimen tilt
$\sigma_1$ & $\sigma_2$=primary stress tensors in specimen surface
$\sigma_\varphi$=stress at φ rotation angle
$S_1$ & ½ $S_2$=X-ray elastic constants $$S_1 = \frac{-\upsilon}{E}$$

$$\frac{1}{2}S_2 = \frac{1+\upsilon}{E}$$

For the present analysis Poisson's Ratio (υ) was set to 0.20, and the elastic modulus (E in GPa) was determined from nano-indentation analysis conducted with a Fischerscope HM2000 in accordance with ISO standard 14577 using a Vickers indenter. Indentation depth was set to 0.25 μm. To determine the modulus for the inner layer, nano-indentation was performed on an AlTiN coated cutting tool substrate. Modulus for the AlTiSiN outer layer was also determined by nano-indentation testing on a coated cutting tool prepared in accordance with embodiments described herein. The modulus (E) value used in the calculation for the residual stress of a coating described herein was the weighted average of the individual modulus value determined for the AlTiN inner layer and the individual modulus value determined for the AlTiSiN outer layer, wherein the weight average was based on thickness of the inner and outer layers of the coating. Multiple $d_{\varphi\psi}$ and $sin^2\psi$ data allowed a linear regression line to be fitted to the data. The resulting line slope is equal to $\sigma_\varphi$. The line intercept approximates the $d_o$ strain free lattice.

In some embodiments, a coating can have one or more of the mechanical properties recited herein, including adherence, prior to post coat blasting. In some embodiments, a coating can have one or more of the mechanical properties recited herein, including adherence, subsequent to post coat blasting.

In another aspect, methods of making coated cutting tools are described herein. In some embodiments, a method of making a coated cutting tool comprises providing a cutting tool substrate and depositing an inner layer of a coating on the substrate by physical vapor deposition, the inner layer comprising aluminum and one or more metallic elements selected from the group consisting of metallic elements of Groups IVB, VB and VIB of the Periodic Table and one or more non-metallic elements selected from the group consisting of non-metallic elements of Groups IIIA, IVA and VIA of the Periodic Table. An outer layer of the coating is deposited over the inner layer by physical vapor deposition, the outer layer comprising aluminum and silicon and one or more metallic elements selected from the group consisting of metallic elements of Groups IVB, VB and VIB of the Periodic Table and one or more non-metallic elements selected from the group consisting of non-metallic elements of Groups IIIA, IVA and VIA of the Periodic Table, wherein the amount of silicon in the outer layer is decreased toward the inner layer.

In some embodiments, an outer layer is deposited over the inner layer by physical vapor deposition, the outer layer comprising a phase composed of aluminum and silicon and one or more metallic elements selected from the group consisting of metallic elements of Groups IVB, VB and VIB of the Periodic Table and one or more non-metallic elements selected from the group consisting of non-metallic elements of Groups IIIA, WA and VIA of the Periodic Table and a phase composed of aluminum and silicon and one or more non-metallic elements selected from the group consisting of non-metallic elements of Groups IIIA, IVA and VIA of the Periodic Table.

Inner and outer layers of a coating described herein can be deposited by conventional PVD techniques including vacuum deposition, sputter deposition, arc vapor deposition or ion plating. Moreover, inner and outer layers deposited according to methods described herein can comprise any of the compositional, chemical and/or physical properties described hereinabove for the inner and outer layers.

In some embodiments, a method of making a coated cutting tool further comprises post coat blasting the PVD deposited coating comprising the inner layer and the outer layer. Post coat blasting can be administered in any desired manner. In some embodiments, post coat blasting comprises shot blasting. In some embodiments, post coat blasting comprises pressure blasting. Pressure blasting can be administered in a variety of forms including compressed air blasting, wet compressed air blasting, pressurized liquid blasting, wet blasting, pressurized liquid blasting and steam blasting.

In some embodiments of methods of making a coated cutting tool described herein, wet blasting is accomplished using a slurry of inorganic particles and water. In some embodiments, the inorganic particles comprise alumina particles. The slurry of alumina particles and water, in some embodiments, is pneumatically projected at a surface of the coated cutting tool body to impinge on the surface of the coating.

The fundamental parameters of the alumina-water slurry are grit (i.e., alumina particles) concentration in volume percent and alumina particle size in micrometers (μm). In some embodiments, the slurry comprises between about 5 volume percent and about 35 volume percent alumina particulates with the balance water. In some embodiments, the slurry comprises between about 8 volume percent and about 25 volume percent alumina particulates with the balance water. In some embodiments, the slurry comprises between about 10 volume percent and about 15 volume percent alumina particulates with the balance water.

In some embodiments, alumina particles can range in size between about 20 μm and about 100 μm. In some embodiments, alumina particles can range in size between about 35 μm and about 75 μm. In some embodiments, alumina particles can range in size between about 45 μm and about 50 μm.

The operating parameters for the wet blasting step are pressure, angle of impingement, distance to the part surface and duration. In this application, the angle of impingement can range from about 45 degrees to about 90 degrees, i.e., the particles impinge the coating surface at an angle ranging from about 45 degrees to about 90 degrees.

In some embodiments, the pressure ranges between about 30 pounds per square inch (psi) and about 55 psi. In some embodiments, the pressure ranges between about 35 psi and about 50 psi. In some embodiments, the distance of the blast nozzle to the part surface ranges from about 1 inch to about 6 inches. The distance between the blast nozzle and the part surface, in some embodiments, ranges from about 3 inches to about 4 inches. Moreover, in some embodiments, the coating of the cutting tool can be blasted for any desired amount of time with the proviso that the outer layer having a composition described herein is not completely removed or substantially completely removed. In some embodiments, the duration of the post coat blast ranges from about 1 second to about 10 seconds. The duration of the post coat blast, in some embodiments, ranges from about 2 seconds to about 8 seconds or from about 3 seconds to about 7 seconds.

In some embodiments, post coat blasting can be administered on coated cutting tools described herein in accordance with the disclosure of U.S. Pat. No. 6,869,334 which is incorporated herein by reference in its entirety. In some embodiments, subjecting the coated cutting tool body to post coat blasting can increase the residual compressive stress in an outer layer of $Al_mTi_{1-(m+z)}Si_zN$ defined herein.

In another aspect, methods of increasing the cutting lifetime of a coated cutting tool are described herein. In some embodiments, a method of increasing the cutting lifetime of a coated cutting tool comprises directing one or more coating fatigue mechanisms to an interface of an inner layer and an outer layer of the coating by producing the inner layer from a composition deposited by physical vapor deposition comprising aluminum and one or more metallic elements selected from the group consisting of metallic elements of Groups IVB, VB and VIB of the Periodic Table and one or more non-metallic elements selected from the group consisting of non-metallic elements of Groups IIIA, IVA and VIA of the Periodic Table and producing the outer layer from a composition deposited by physical vapor deposition comprising aluminum and silicon and one or more metallic elements selected from the group consisting of metallic elements of Groups IVB, VB and VIB of the Periodic Table and one or more non-metallic elements selected from the group consisting of non-metallic elements of Groups IIIA, IVA and VIA of the Periodic Table, wherein the amount of silicon in the outer layer decreases toward the inner layer.

Inner and outer layers according to methods of increasing the cutting lifetime of a coated cutting tool described herein can comprise any of the compositional, chemical and/or physical properties described hereinabove for the inner and outer layers.

In some embodiments, directing comprises initiating one or more coating fatigue mechanisms at an interface of the inner layer and the outer layer of the coating. In some embodiments, coating fatigue mechanisms comprise cracking, delamination, flaking or combinations thereof.

These and other embodiments are further illustrated by the following non-limiting examples.

EXAMPLE 1

Coated Cutting Tool Body

A coated cutting tool body described herein was produced by placing a cemented tungsten carbide (WC) cutting insert substrate having a cobalt binder into a MP323 PVD apparatus commercially available from Metaplas Ionon Oberflächentechnik GmbH of Bergisch-Gladback, Germany. The WC substrate was heated to a temperature of 530° C., and the aluminum and titanium constituents of the inner layer were vaporized from a series of cathodes having a composition of 67% Al and 33% while $N_2$ was fed in as a reactive gas at a pressure of $5\ E^{-2}$ mbar to deposit the crystalline AlTiN inner layer on the WC substrate. The inner layer had a thickness of about 2 μm.

After forming the inner layer on the surface of the WC substrate, the outer layer was deposited by cathodic evaporation of the elemental constituents of Al, Ti and Si while $N_2$ was fed in as a reactive gas at a pressure of 8 $E^{-3}$ mbar. The outer layer was adhered to the AlTiN inner layer, the outer layer comprising an AlTiSiN crystalline phase and an AlSiN crystalline phase. AlTi cathodes were used in conjunction with AlTiSi cathodes for a portion of the deposition of the outer layer. The AlTiSiN/AlSiN outer layer had a thickness of about 0.5 µm.

Figure 2:
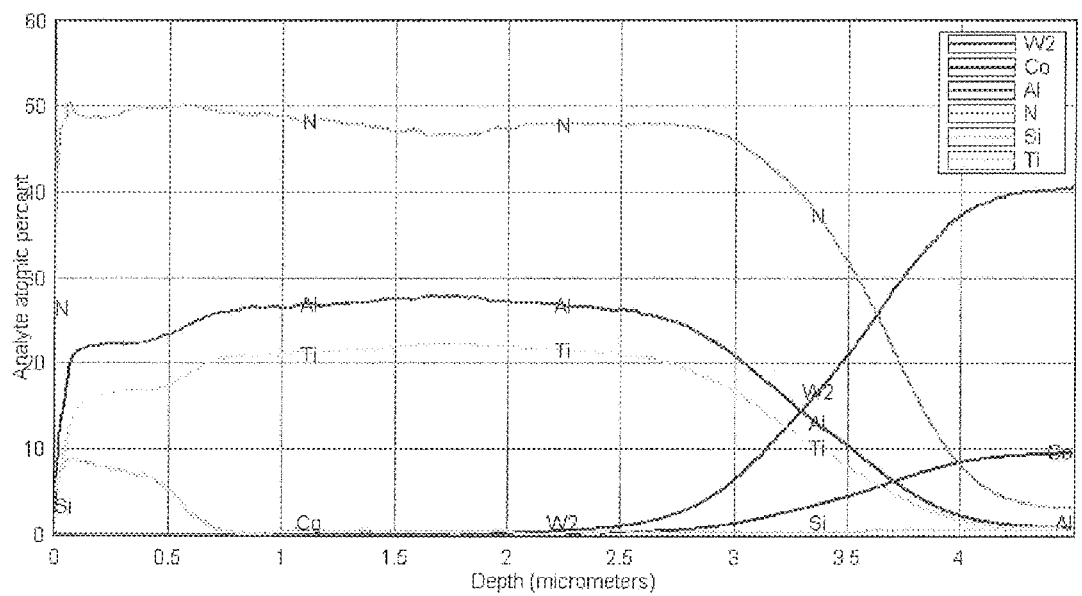
FIG. 2 illustrates a glow discharge spectrum of a coated cutting tool according to one embodiment described herein.
Figure 3:
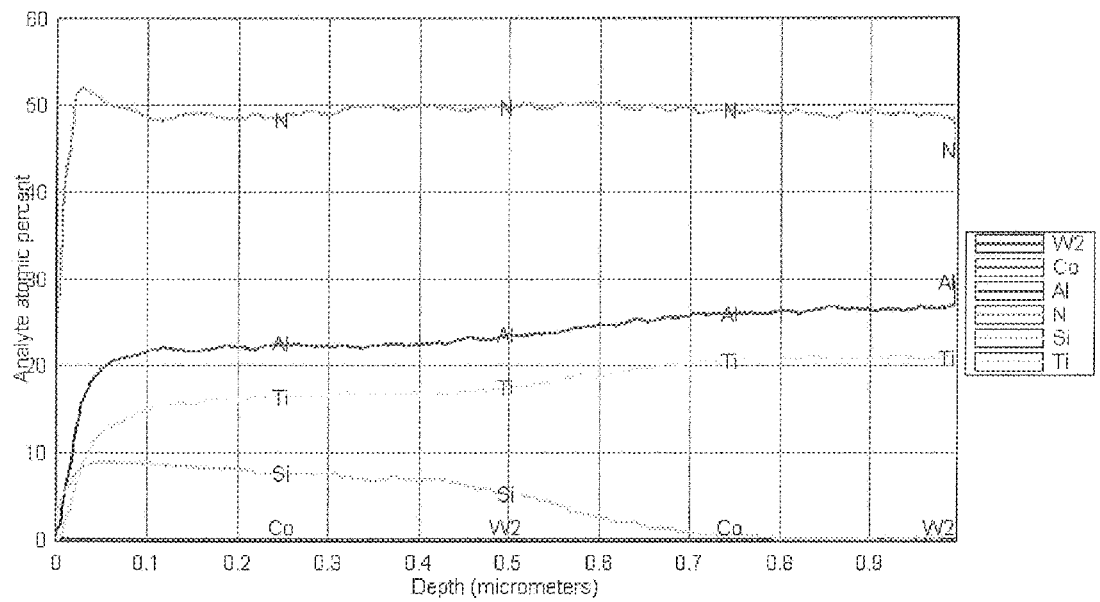
FIG. 3 illustrates a sectional view of the glow discharge spectrum of FIG. 2.

FIG. 2 illustrates a glow discharge (GDS) spectrum of the coated cutting tool. As illustrated in the spectrum, the silicon content of the outer layer decreases in amount toward the TiAlN inner layer, thereby providing a silicon gradient in the AlTiSiN/AlSiN outer layer. FIG. 3 is a sectional view of the glow discharge spectrum of FIG. 2 further illustrating the silicon gradient of the AlTiSiN/AlSiN outer layer.

Figure 4:
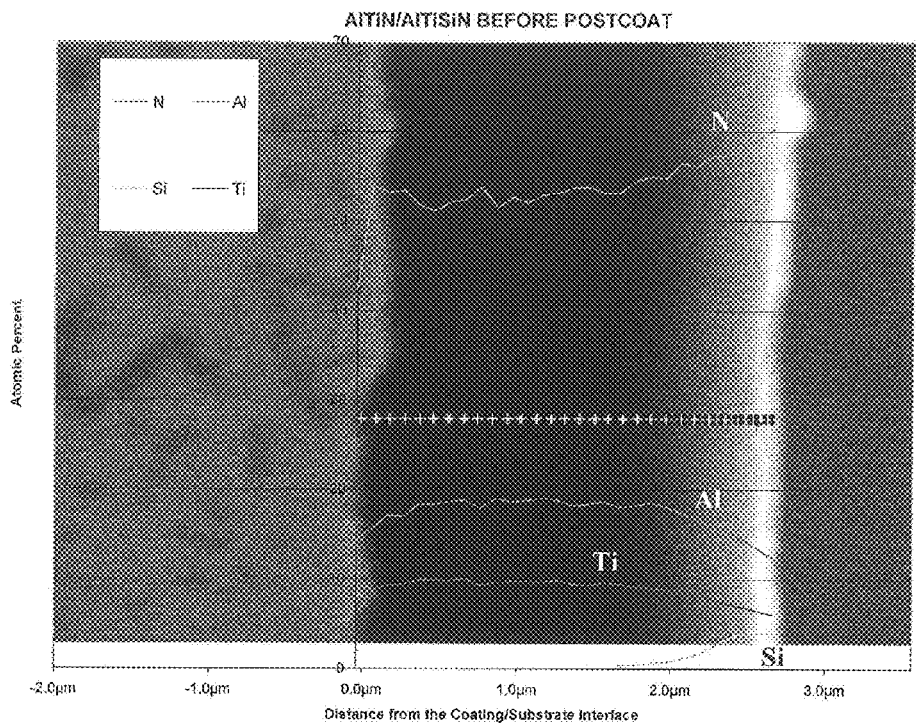
FIG. 4 illustrates an energy dispersive spectrum of a coating according to one embodiment described herein.

FIG. 4 illustrates an energy dispersive (EDS) spectrum of the produced coating. Similar to the GDS, the EDS also demonstrated a silicon gradient in the outer layer, wherein the silicon content decreased toward the AlTiN inner layer.

Figure 5:
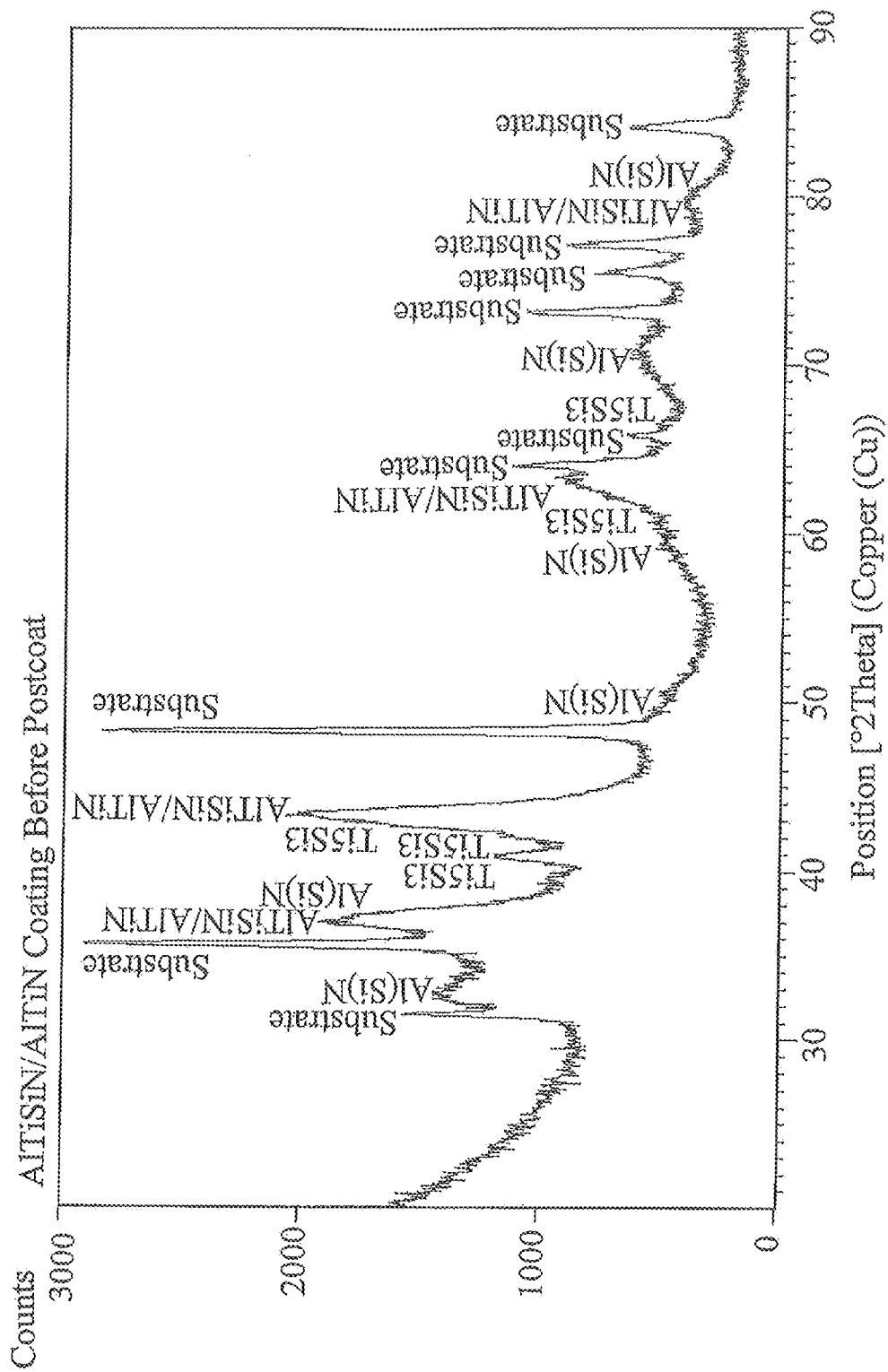
FIG. 5 illustrates an X-ray diffractogram of a coated cutting tool according to one embodiment described herein.

FIG. 5 illustrates an X-ray diffractogram of the coating. The diffractogram of FIG. 5 provides reflections associated with the WC substrate, the AlTiN inner layer and the outer layer comprising phases of cubic AlTiSiN and hexagonal AlSiN.

Figure 6:
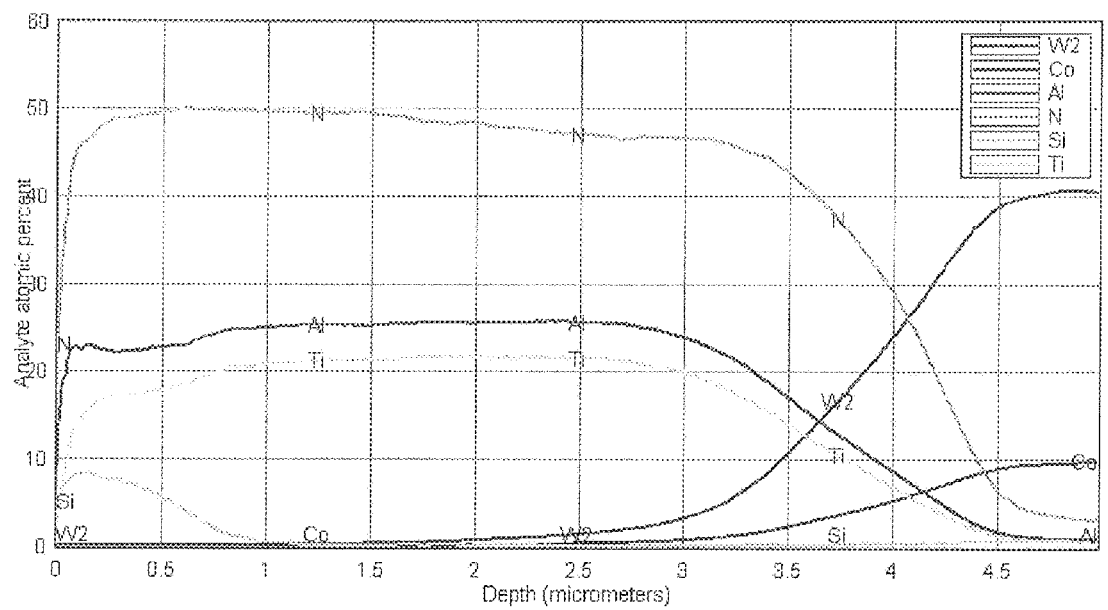
FIG. 6 illustrates a glow discharge spectrum of a post coat treated cutting tool according to one embodiment described herein.
Figure 7:
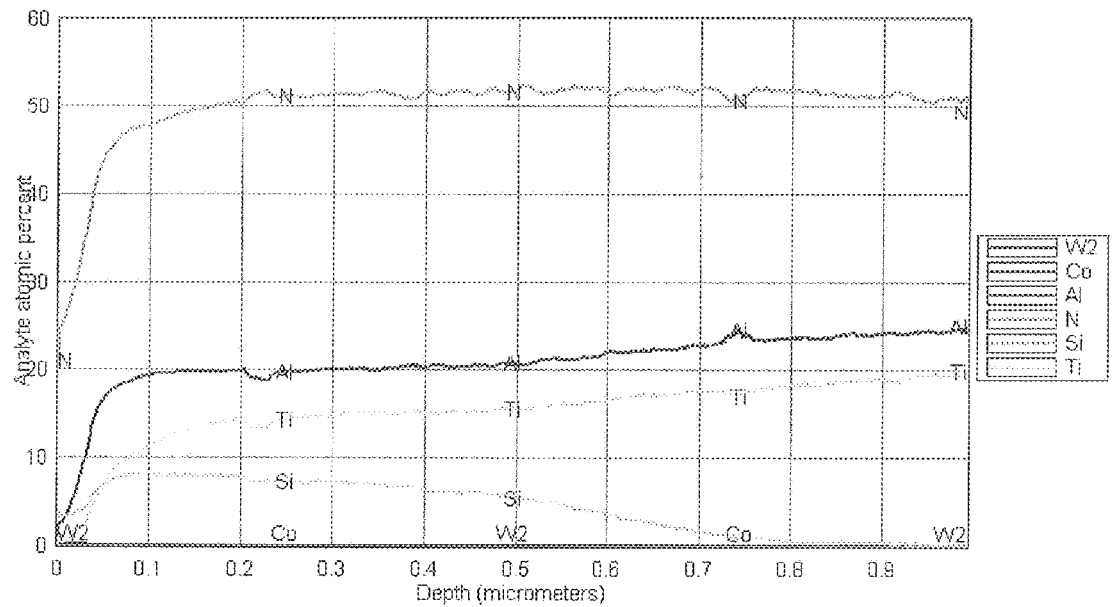
FIG. 7 is a sectional view of the glow discharge spectrum of FIG. 6.
Figure 8:
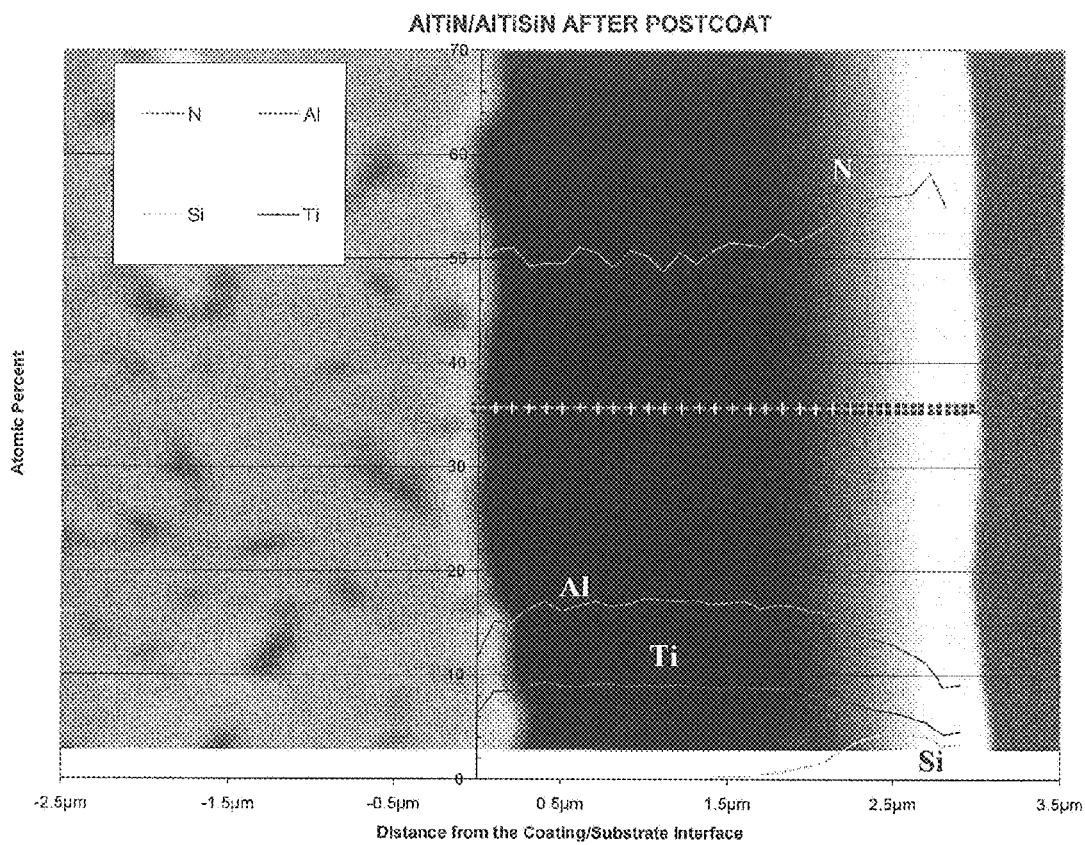
FIG. 8 is an energy dispersive spectrum of a post coat treated coating according to one embodiment described herein.

The coated cutting tool body was subsequently subjected to a post coat treatment with an alumina slurry consistent with the post coat blasting parameters provided hereinabove. FIG. 6 illustrates a GDS of the coated cutting tool after post coat treatment. The GDS of FIG. 6 indicates that the post coat treatment did not alter the compositional parameters of the coating, including the silicon gradient in the outer layer. FIG. 7 is a sectional view of the GDS of FIG. 6 further illustrating the static compositional nature of the coating subsequent to post coat treatment. FIG. 8 is an EDS of the coating also demonstrating substantially no change to the compositional parameters of the coating after post coat treatment.

Figure 9:
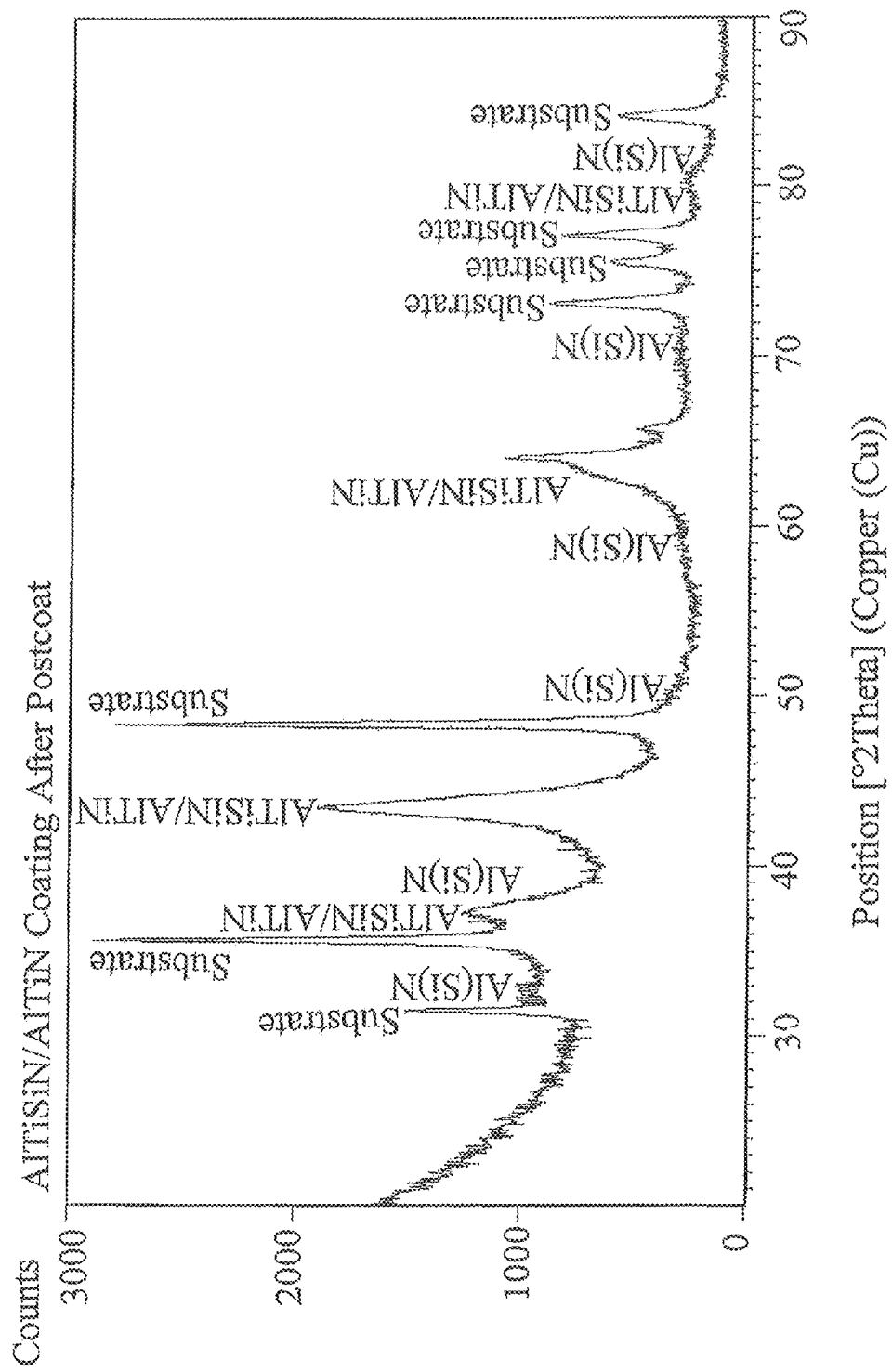
FIG. 9 is an X-ray diffractogram of a post coat treated cutting tool according to one embodiment described herein.

Moreover, FIG. 9 illustrates an X-ray diffractogram of the coating subsequent to post coat treatment. As illustrated in FIG. 9, the crystalline AlTiSiN and AlSiN phases of the outer layer remained after post coat treatment.

EXAMPLE 2

Cutting Tool Lifetime

Coated cutting tools described herein were subjected to cutting lifetime testing in comparison with prior art coated cutting tools. Non-limiting embodiments of coated cutting tools of the present invention, A, B, C and D, were produced in accordance with Example 1 above. Compositional parameters of cutting tools A, B, C and D and cutting tools of the prior art, E and F, are provided in Table I.

TABLE I

Coating Compositional Parameters

| Coated Cutting Tool | Substrate | First Layer | Second Layer | Post Coat Blast* |
|---|---|---|---|---|
| A | WC, Co binder | AlTiN | AlTiSiN/AlSiN | 3 seconds |
| B | WC, Co binder | AlTiN | AlTiSiN/AlSiN | 3 seconds |
| C | WC, Co binder | AlTiN | AlTiSiN/AlSiN | 4 seconds |
| D | WC, Co binder | AlTiN | AlTiSiN/AlSiN | 4 seconds |
| E | WC, Co binder | AlTiN | — | — |
| F | WC, Co binder | AlTiN | — | — |

*Wet blast of 50 µm alumina particle water slurry

Coated cutting tools A-F were subjected to cutting lifetime testing in a 304 stainless steel outer diameter (OD) turning test. The cutting conditions were as follows:

Cutting Speed—91 m/min

Feed Rate—0.41 mm/rev.

Depth of Cut—2.03 mm

Workpiece material—304SS

Coolant—Flood

The results of the cutting lifetime test are provided in Table II.

TABLE II

Coated Cutting Tool Lifetime Results

| Coated Cutting Tool | Cutting Lifetime (minutes) |
|---|---|
| A | 31.2 |
| B | 30.9 |
| C | 31.4 |
| D | 32.5 |
| E | 15.7 |
| F | 18.2 |

As provided in Table II, cutting tools having the coating architecture described herein (A-D) demonstrated a significant increase in cutting lifetime in comparison with the prior art coated cutting tools (E, F)

EXAMPLE 3

Cutting Tool Lifetime

Coated cutting tools described herein were subjected to cutting lifetime testing in comparison with prior art coated cutting tools. Non-limiting embodiments of coated cutting tools of the present invention, J and K, were produced in accordance with Example 1 above. Compositional parameters of coated cutting tools J and K and prior art coated cutting tools L and M are provided in Table III.

TABLE III

Coating Compositional Parameters

| Coated Cutting Tool | Substrate | First Layer | Second Layer | Post Coat Blast* |
|---|---|---|---|---|
| J | WC, Co binder | AlTiN | AlTiSiN/AlSiN | 5 seconds |
| K | WC, Co binder | AlTiN | AlTiSiN/AlSiN | 5 seconds |
| L | WC, Co binder | AlTiN | — | — |
| M | WC, Co binder | AlTiN | — | — |

*Wet blast of 50 µm alumina particle water slurry

Coated cutting tools J-M were subjected to cutting lifetime testing in an Inconel 718 outer diameter (OD) turning test. The cutting conditions were as follows:

Cutting Speed—91 m/min

Feed Rate—0.15 mm/rev.

Depth of Cut—0.25 mm

Workpiece material—IN718

Coolant—Flood

The results of the cutting lifetime test are provided in Table IV.

TABLE IV

| Coated Cutting Tool Lifetime Results | |
|---|---|
| Coated Cutting Tool | Cutting Lifetime (minutes) |
| J | 12.5 |
| K | 12.8 |
| L | 10.8 |
| M | 9.0 |

As provided in Table IV, cutting tools having the coating architecture described herein (J, K) demonstrated an increase in cutting lifetime in comparison with the prior art coated cutting tools (L, M).

Various embodiments of the invention have been described in fulfillment of the various objects of the invention. It should be recognized that these embodiments are merely illustrative of the principles of the present invention. Numerous modifications and adaptations thereof will be readily apparent to those skilled in the art without departing from the spirit and scope of the invention.

That which is claimed is:

1. A coated cutting tool comprising:
a substrate; and
a coating adhered to the substrate, the coating comprising:
an inner layer deposited by physical vapor deposition comprising aluminum, one or more metallic elements selected from the group consisting of metallic elements of Groups IVB, VB and VIB of the Periodic Table and one or more non-metallic elements selected from the group consisting of nitrogen and non-metallic elements of Groups IIIA, IVA and VIA of the Periodic Table; and
an outer layer deposited by physical vapor deposition over the inner layer, the outer layer comprising aluminum and silicon and one or more metallic elements selected from the group consisting of metallic elements of Groups IVB, VB and VIB of the Periodic Table and one or more non-metallic elements selected from the group consisting of nitrogen and non-metallic elements of Groups IIIA, IVA and VIA of the Periodic Table, wherein the amount of silicon in the outer layer decreases toward the inner layer.

2. The coated cutting tool of claim 1, wherein the inner layer is polycrystalline.

3. The coated cutting tool of claim 1, wherein the outer layer is polycrystalline.

4. The coated cutting tool of claim 1, wherein the inner layer comprises $Al_aTi_{1-a}N$ where $0<a<1$.

5. The coated cutting tool of claim 4, wherein $0.35 \leq a \leq 0.75$.

6. The coated cutting tool of claim 4, wherein the outer layer comprises $Al_mTi_{1-(m+z)}Si_zN$ where $0<m<1$ and $0<z<1$ and $(m+z)<1$.

7. The coated cutting tool of claim 6, wherein $0.05 \leq m \leq 0.7$ and $0.01 \leq z \leq 0.3$.

8. The coated cutting tool of claim 6, wherein the $Al_mTi_{1-(m+z)}Si_zN$ has a cubic crystalline phase.

9. The coated cutting tool of claim 6, wherein the outer layer further comprises $Al_{1-k}Si_kN$ where $0<k<1$.

10. The coated cutting tool of claim 9, wherein the $Al_{1-k}Si_kN$ has a hexagonal crystalline structure.

11. The coated cutting tool of claim 1, wherein the substrate comprises a cemented tungsten carbide.

12. The coated cutting tool of claim 1, wherein the coating has a residual compressive stress of at least about 2500 MPa.

13. The coated cutting tool of claim 1, wherein the coating is in a post coat blasted state having a residual compressive stress of at least about 3400 MPa.

14. The coating cutting tool of claim 1, wherein the coating is in a post coat blasted state having a ratio of residual compressive stress in the post coat blasted state to residual compressive stress in the non-post coat blasted state of greater than or equal to 1.2.

15. A method of making a coated cutting tool comprising: providing a substrate; and depositing an inner layer of a coating on the substrate by physical vapor deposition, the inner layer comprising aluminum and one or more metallic elements selected from the group consisting of metallic elements of Groups IVB, VB and VIB of the Periodic Table and one or more non-metallic elements selected from the group consisting of nitrogen and non-metallic elements of Groups IIIA, IVA and VIA of the Periodic Table; and depositing an outer layer of the coating over the inner layer by physical vapor deposition, the outer layer comprising aluminum and silicon and one or more metallic elements selected from the group consisting of metallic elements of Groups IVB, VB and VIB of the Periodic Table and one or more non-metallic elements selected from the group consisting of nitrogen and non-metallic elements of Groups IIIA, IVA and VIA of the Periodic Table, wherein the amount of silicon in the outer layer is decreased toward the inner layer.

16. The method of claim 15, wherein the inner layer comprises $Al_aTi_{1-a}N$ where $0<a<1$.

17. The method of claim 15, wherein the outer layer comprises $Al_mTi_{1-(m+z)}Si_zN$ where $0<m<1$ and $0<z<1$ and $(m+z)<1$.

18. The method of claim 15, wherein the substrate comprises a cemented tungsten carbide.

19. The method of claim 15 further comprising subjecting the outer layer to post coat blasting.

20. The method of claim 19, wherein the coating has a residual compressive stress of greater than or equal to about 3400 MPa.

* * * * *

UNITED STATES PATENT AND TRADEMARK OFFICE
CERTIFICATE OF CORRECTION

PATENT NO.      : 8,859,114 B2                                       Page 1 of 1
APPLICATION NO. : 13/860279
DATED           : October 14, 2014
INVENTOR(S)     : Aaharon Inspektor et al.

It is certified that error appears in the above-identified patent and that said Letters Patent is hereby corrected as shown below:

On the Title Page, in Item (75), under "Inventors", in Column 1, Line 2, delete "Nicholas F" and insert -- Nicholas F. --, therefor.

On the Title Page, in Item (75), under "Inventors", in Column 1, Line 3, delete "Michael F" and insert -- Michael F. --, therefor.

On the Title Page, in Item (75), under "Inventors", in Column 1, Line 4, delete "Mark J" and insert -- Mark J. --, therefor.

IN THE SPECIFICATION

In Column 6, Line 54, delete "(m+n++p+q+r+s+z) <1" and insert -- (m+n+o+p+q+r+s+z) <1 --, therefor.

In Column 7, Line 47, delete "Eulerean" and insert -- Eulerian --, therefor.

In Column 8, Line 10, delete "Pseudo-Voight" and insert -- Pseudo-Voigt --, therefor.

In Column 11, Lines 46-47, delete

" $$\text{with } \tau = \frac{t}{\beta} \times \frac{(1 - \beta \times e^{-\beta} - e^{-\beta})}{1 - e^{-\beta}}$$ "

insert -- $$\text{with } \tau = \frac{t}{\beta} x \frac{(1-\beta)xe^{-\beta} - e^{-\beta}}{1 - e^{-\beta}}$$ --.

In Column 14, Line 60, delete "Bergisch-Gladback," and insert -- Bergisch-Gladbach, --, therefor.

Signed and Sealed this
Eleventh Day of August, 2015

Michelle K. Lee
*Director of the United States Patent and Trademark Office*